United States Patent
Wu et al.

(10) Patent No.: US 11,438,200 B2
(45) Date of Patent: Sep. 6, 2022

(54) FREQUENCY OFFSET COMPENSATION AT REFLECTOR DURING FREQUENCY COMPENSATION INTERVAL

(71) Applicant: Silicon Laboratories Inc., Austin, TX (US)

(72) Inventors: Michael A. Wu, Austin, TX (US); Wentao Li, Austin, TX (US); Yan Zhou, Spicewood, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 17/107,305

(22) Filed: Nov. 30, 2020

(65) Prior Publication Data

US 2022/0173946 A1   Jun. 2, 2022

(51) Int. Cl.
| | |
|---|---|
| *H04L 27/06* | (2006.01) |
| *H03L 7/23* | (2006.01) |
| *H04L 27/00* | (2006.01) |
| *H03D 7/16* | (2006.01) |

(52) U.S. Cl.
CPC ............. *H04L 27/06* (2013.01); *H03D 7/165* (2013.01); *H03L 7/23* (2013.01); *H04L 27/0014* (2013.01); *H03D 2200/0082* (2013.01); *H04L 2027/0016* (2013.01)

(58) Field of Classification Search
CPC ............ H03D 7/165; H03D 2200/0082; H04L 27/0014; H04L 2027/0016; H04L 27/06
USPC .................................. 375/219–220, 356, 358
See application file for complete search history.

(56) References Cited

U.S. PATENT DOCUMENTS

| | | | |
|---|---|---|---|
| 7,676,210 B2 | 3/2010 | Paulus | |
| 8,295,404 B1 | 10/2012 | Husted | |
| 8,531,216 B1 * | 9/2013 | Wu | H03J 7/04 |
| | | | 327/144 |
| 8,615,213 B2 | 12/2013 | de Ruijter et al. | |
| 9,020,073 B2 | 4/2015 | van Waasen et al. | |
| 9,720,875 B2 | 8/2017 | de Ruijter et al. | |
| 10,061,740 B2 | 8/2018 | de Ruijter et al. | |

(Continued)

OTHER PUBLICATIONS

Bluetooth SIG, Inc., "High Accuracy Distance Measurement," Bluetooth® Final Improvement Proposal Document (FIPD), Revision r07, Nov. 11, 2020, 98 pages.

(Continued)

*Primary Examiner* — Emmanuel Bayard
(74) *Attorney, Agent, or Firm* — Zagorin Cave LLP (57) ABSTRACT

A method for communicating between a first radio frequency communications device including a first local oscillator and a second radio frequency communications device including a second local oscillator includes receiving a packet using a receiver of the first radio frequency communications device. The method includes detecting an average frequency offset based on sequential samples of the packet. The method includes applying a first adjustment to the first local oscillator to reduce a frequency offset between the first local oscillator and the second local oscillator. The first adjustment is based on the average frequency offset. The method includes, after adjusting the first local oscillator, transmitting a second packet to the second radio frequency communications device by the first radio frequency communications device using the first adjustment and the first local oscillator.

21 Claims, 7 Drawing Sheets

(56) References Cited

U.S. PATENT DOCUMENTS

| | | |
|---|---|---|
| 10,172,105 B2 | 1/2019 | de Ruijter et al. |
| 2002/0097820 A1 | 7/2002 | Simmons |
| 2004/0120412 A1 | 6/2004 | Banerjea |
| 2004/0203470 A1 | 10/2004 | Berliner et al. |
| 2005/0190098 A1 | 9/2005 | Bridgelall et al. |
| 2007/0110096 A1 | 5/2007 | Geile et al. |
| 2010/0020909 A1* | 1/2010 | Jung ............... H04J 3/0667 375/371 |
| 2011/0129048 A1* | 6/2011 | Barbe ............. H04W 56/0015 375/371 |
| 2012/0288040 A1 | 11/2012 | Yi |
| 2013/0080817 A1* | 3/2013 | Mihelic ............... G06F 1/10 713/401 |
| 2013/0241774 A1* | 9/2013 | Shin ................... G01S 5/06 342/387 |
| 2013/0259049 A1* | 10/2013 | Mizrahi ............. H04J 3/0664 370/392 |
| 2013/0272322 A1* | 10/2013 | Sagarwala ......... H04J 3/0658 370/508 |
| 2015/0110231 A1* | 4/2015 | Alexander ........ H04L 27/2662 375/362 |
| 2015/0280841 A1 | 10/2015 | Gudovskiy et al. |
| 2016/0308633 A1* | 10/2016 | Liu .................... H04L 7/0331 |
| 2019/0081834 A1 | 3/2019 | de Ruijter et al. |
| 2019/0306821 A1* | 10/2019 | Hu .................. H04W 56/0045 |
| 2019/0332137 A1* | 10/2019 | Benjamini ......... G06F 13/4282 |
| 2020/0166631 A1 | 5/2020 | Tong |
| 2020/0292665 A1 | 9/2020 | Behrens et al. |
| 2021/0058181 A1* | 2/2021 | Dwivedi ............ H04J 3/0667 |

OTHER PUBLICATIONS

Bluetooth SIG, Inc., "High-Accuracy Distance Measurement," Bluetooth® Draft Improvement Proposal Document (DIPD), Revision r11, Dec. 16, 2019, 79 pages.

Bluetooth SIG, Inc, "Supplement to the Bluetooth Core Specification," Bluetooth® Specification, Revision v9, Dec. 31, 2019, 37 pages.

Huang, B., et al., "A Robust Indoor Positioning Method Based on Bluetooth Low Energy with Separate Channel Information," Sensors, vol. 19, Issue 16, Aug. 9, 2019, 19 pages.

Zand, P., et al. "A High-Accuracy Phase-Based Ranging Solution with Bluetooth Low Energy (BLE)," 2019 IEEE Wireless Communications and Networking Conference (WCNC), Apr. 15-18, 2019, Marrkesh, Morocco, 9 pages.

* cited by examiner

FREQUENCY OFFSET COMPENSATION AT REFLECTOR DURING FREQUENCY COMPENSATION INTERVAL

CROSS-REFERENCE TO RELATED APPLICATION(S)

This application is related to application Ser. No. 17/107,281, filed Nov. 30, 2020, entitled "PHASE MEASUREMENTS FOR HIGH ACCURACY DISTANCE MEASUREMENTS," naming John M. Khoury, Yan Zhao, and Michael A. Wu as inventors, application Ser. No. 17/107,316, filed Nov. 30, 2020, entitled "CORRECTION OF FREQUENCY OFFSET BETWEEN INITIATOR AND REFLECTOR," naming Michael A. Wu, Wentao Li, John M. Khoury, and Yan Zhou as inventors, and application Ser. No. 17/107,327, filed Nov. 30, 2020, entitled "DC OFFSET COMPENSATION IN ZERO-INTERMEDIATE FREQUENCY MODE OF A RECEIVER," naming Michael A. Wu, Wentao Li, Mitchell Reid, John M. Khoury, and Yan Zhou, as inventors, which applications are incorporated herein by reference.

BACKGROUND

Field of the Invention

This disclosure relates to communications systems in general, and more particularly to radio frequency (RF) communications systems with frequency offset estimation and compensation.

Description of the Related Art

In general, a location of a wireless device in a plane (i.e., two dimensions) can be determined using triangulation (e.g., using two angle measurements), trilateration (e.g., using three distance measurements), or a combination thereof. Ranging techniques include Received Signal Strength Indicator (RSSI)-based, time-based and phase-based distance measurement. Since RSSI-based measurement is susceptible to multi-path fading and complicated noise interference in indoor applications, time-based or phase-based distance measurement is preferably used in short range radio frequency communications systems (e.g., systems compliant with Bluetooth™, Bluetooth™ Low Energy (BLE), Zigbee™, or other local area network protocol standards).

Bluetooth Low Energy is an exemplary communications protocol designed for low power and low latency applications. A BLE device (i.e., a device compliant with the BLE standardized communications protocol) consumes substantially less power than conventional Bluetooth (i.e., Bluetooth classic) devices (i.e., devices compliant with the Bluetooth standardized communications protocol). An exemplary BLE device can start data transmission much faster than conventional Bluetooth devices. Accordingly, BLE devices can be on constantly or frequently turned on and off so they can communicate intermittently with other devices. A BLE communications device implements phase-based distance measurements. Phase-based distance measurements rely on the phase shift $\phi$ introduced by a pure line of sight radio channel on a radio signal being a linear function of frequency f and range R, i.e., $$\phi = 2\pi f \frac{R}{c} \pmod{2\pi},$$

where c is the speed of light in a vacuum. Thus, the BLE device determines a distance between itself and another BLE device by measuring the slope of the phase as a function of frequency.

A BLE device that starts the ranging-technique is referred to as an initiator. Another BLE device that responds to the initiator is referred to as a reflector. After a frequency calibration phase, the initiator transmits a local oscillator signal (i.e., a continuous wave tone having frequency $f_k$) to the reflector using a first channel. The reflector measures phase $\phi_R$ of the received carrier to determine the phase of the initiator local oscillator as seen at the reflector:

$$\phi_R = -2\pi f_k \left(\frac{R}{c} - \Delta_t\right) - \theta \pmod{2\pi},$$

where $\Delta_t$ is a time offset (i.e., propagation time) between the initiator and reflector and $\theta$ is a phase difference between the local oscillator signal of the initiator and the local oscillator of the reflector. Phase $\phi_R$ depends on the local oscillator of the initiator, the local oscillator of the reflector, and the distance between them. However, in some embodiments of a BLE communications system, the frequency (a frequency of 2.4 GHz) corresponds to a wavelength (e.g., wavelength of approximately 12 cm) that causes phase to wrap, resulting in ambiguity in the distance measurement. That ambiguity is resolved by measuring the phase shift using two (or more) distinct tones (e.g., tones having a different of 1 MHz):

$$\phi_R = \phi_{R1} - \phi_{R2} = 2\pi(f_1 - f_2)\left(\frac{R}{c} - \Delta_t\right) \pmod{2\pi}.$$

The phase still wraps but occurs with respect to a frequency corresponding to $f_1-f_2$ (e.g., 1 MHz). Similarly, the reflector sends continuous wave tones over the same channel to the initiator so that the initiator can measure phase $\phi_I$ to determine the phase of the reflector local oscillator as seen at the initiator:

$$\phi_I = -2\pi f_k \left(\frac{R}{c} + \Delta_t\right) + \theta \pmod{2\pi};$$

$$\phi_I = \phi_{I1} - \phi_{I2} = 2\pi(f_1 - f_2)\left(\frac{R}{c} - \Delta_t\right).$$

The communications devices may repeat this procedure for at least one additional channel in the frequency band to reduce effects of multipath fading on the distance measurement and other impairments.

The reflector sends phase measurements to the initiator. The initiator calculates round trip phase $\phi_{RT}$ by adding the two phase measurements together:

$$\phi_{RT} = \phi_I + \phi_R = 4\pi(f_1 - f_2)\frac{R}{c}.$$

The initiator calculates the round trip range R:

$$R = \frac{c(\phi_{RT1} - \phi_{RT2})}{4\pi(f_1 - f_2)} = \frac{c(\phi_{R1} - \phi_{R2})}{4\pi(f_1 - f_2)},$$

where $\phi_{RT1}=\phi_{I1}+\phi_{R1}$ and $\phi_{RT2}=\phi_{I2}+\phi_{R2}$. Note that θ, the constant phase offset between the transmitter and receiver local oscillators of the reflector cancels when two frequencies are used to measure range R.

In at least one embodiment, the range calculation meets BLE standardized communication protocol specifications in a high accuracy mode of operation if the range calculation is within ±10% for distances >5 m, and is <±0.50 m if the distance is <5 m for a target maximum distance measurement of approximately 50 m and a maximum speed of the initiator with respect to the reflector of 5 km/h. The phase measurement performance at each device is critical to the round-trip range calculation. Noise or any frequency offset or frequency drift between the local oscillator of the initiator and a target frequency and between the local oscillator of the reflector and the target frequency can introduce error into the range measurement. Accordingly, techniques that reduce or eliminate effects of noise or frequency offset or frequency drift on phase measurements are desired.

SUMMARY OF EMBODIMENTS OF THE INVENTION

In at least one embodiment, a method for communicating between a first radio frequency communications device including a first local oscillator and a second radio frequency communications device including a second local oscillator includes receiving a packet using a receiver of the first radio frequency communications device. The method includes detecting an average frequency offset based on sequential samples of the packet. The method includes applying a first adjustment to the first local oscillator to reduce a frequency offset between the first local oscillator and the second local oscillator. The first adjustment is based on the average frequency offset. The method includes, after adjusting the first local oscillator, transmitting a second packet to the second radio frequency communications device by the first radio frequency communications device using the first adjustment and the first local oscillator.

In at least one embodiment, a radio frequency communications system includes a first radio frequency communications device. The first radio frequency communications device includes a receiver. The receiver includes a first local oscillator, a detector configured to generate an average frequency offset based on sequential samples of a packet, and a digital circuit configured to apply a first adjustment to the first local oscillator to reduce a frequency offset between the first local oscillator and a second local oscillator of a second radio frequency communications device. The first adjustment is based on the average frequency offset.

A method for measuring a distance between a first radio frequency communications device including a first local oscillator and a second radio frequency communications device including a second local oscillator includes receiving, by the first radio frequency communications device, a request to initiate communications from the second radio frequency communications device. The method includes receiving a packet by the first radio frequency communications device after the first radio frequency communications device transmits a response to the request. The method includes applying a first adjustment to the first local oscillator to reduce a frequency offset between the first local oscillator and the second local oscillator, the first adjustment being based on the packet. The method includes transmitting a second packet to the second radio frequency communications device by the first radio frequency communications device using the first local oscillator and the first adjustment. The method includes after transmission of the second packet, transmitting a continuous wave tone by the first radio frequency communications device using the first local oscillator and the first adjustment. The method includes applying a second adjustment to the second local oscillator at the second radio frequency communications device to reduce the frequency offset between the first local oscillator and the second local oscillator. The second adjustment is based on the continuous wave tone received by the second radio frequency communications device.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

Figure 1:
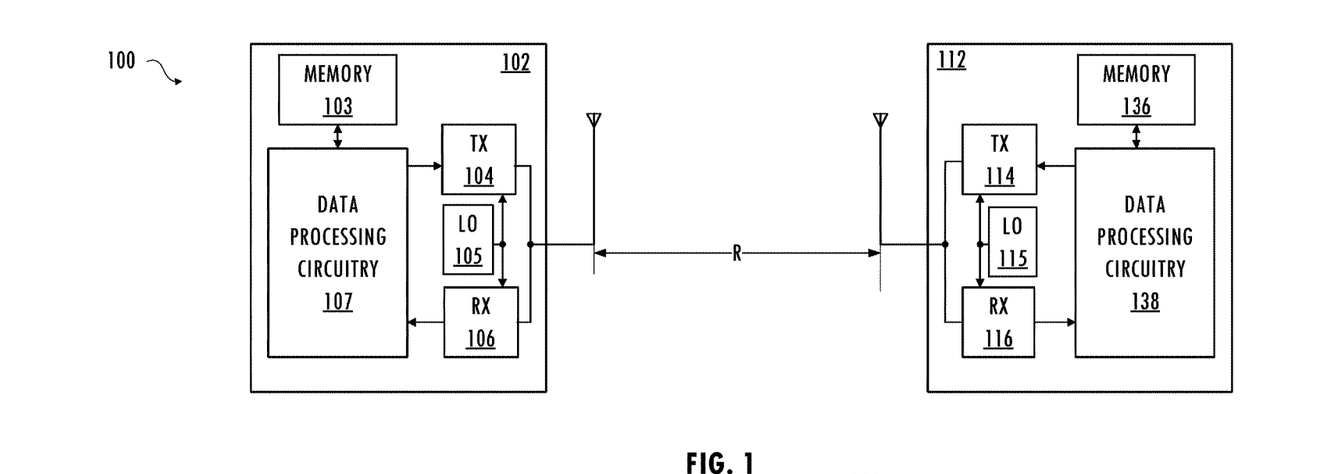
FIG. 1 illustrates a functional block diagram of an exemplary wireless communications system.

Referring to FIG. 1 in at least one embodiment, a wireless communications system includes wireless communications device 102, which includes transmitter 104, receiver 106, data processing circuitry 107, memory 103, and local oscillator 105, and wireless communications device 112, which includes transmitter 114, receiver 116, data processing circuitry 138, memory 136, and local oscillator 115. Wireless communications device 102 is distance R away from wireless communications device 112. Although wireless communications device 102 and wireless communications device 112 are illustrated as including only one antenna each, in other embodiments of wireless communications system 100, wireless communications device 102 and wireless communications device 112 each include multiple antennas. Wireless communications system 100 is compliant with the BLE standardized communications protocol designed for low power and low latency applications. However, in other embodiments, wireless communications system 100 is compliant with other wireless communications protocols (e.g., Bluetooth Classic, Zigbee, or other short-range radio frequency protocol standards). Local oscillator 105 and local oscillator 115 provide signals used in transceiver functions of wireless communications device 102 and wireless communications device 112, respectively. If wireless communications device 102 and wireless communications device 112 are manufactured by different vendors, then the frequency of local oscillator 105 can be substantially different from the frequency of local oscillator 115. However, for phase measurements, the transmitted continuous wave signals sent by the initiator or reflector are nominally the same. If not properly taken into account, random frequency errors between the initiator and the reflector continuous wave signals (e.g., ±40 ppm on each side) can introduce errors into a measurement of distance R made by wireless communications system 100.

Figure 2:
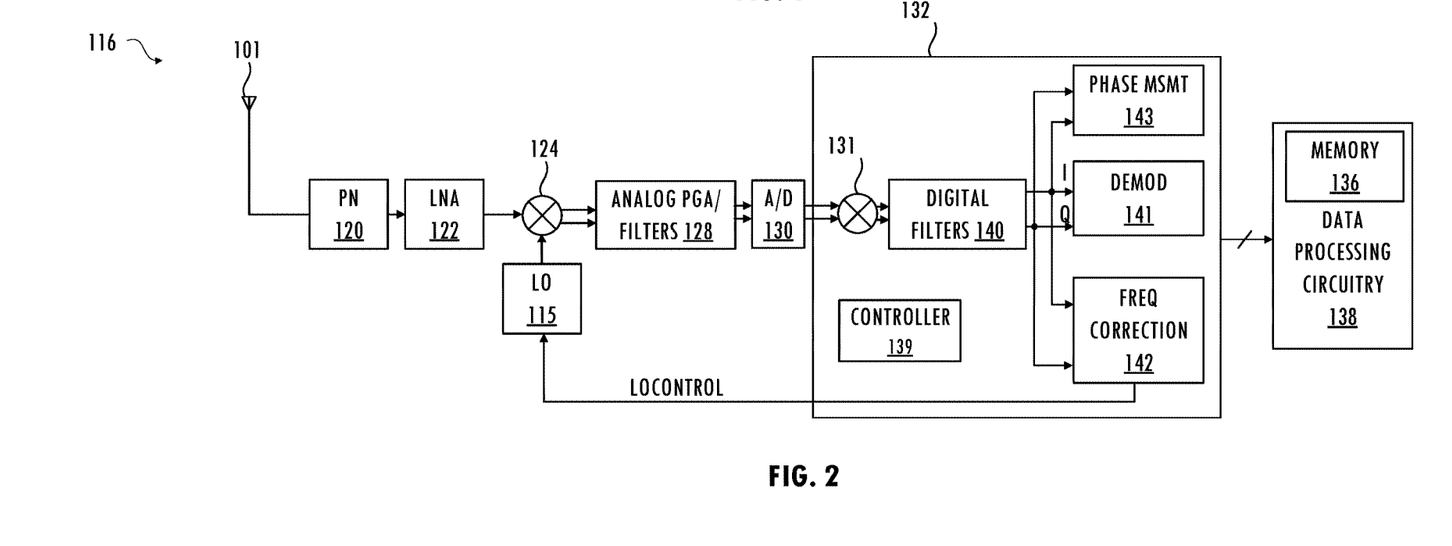
FIG. 2 illustrates a functional block diagram of an exemplary receiver of a wireless communications device.

FIG. 2 illustrates an exemplary embodiment of a receiver that may be included in wireless communications device 102 or wireless communications device 112. Antenna 101 provides an RF signal to passive network 120, which provides impedance matching, filtering, and electrostatic discharge protection. Passive network 120 is coupled to low-noise amplifier (LNA) 122, which amplifies the RF signal without substantial degradation to the signal-to-noise ratio and provides the amplified RF signal to frequency mixer 124. Frequency mixer 124 performs frequency translation or shifting of the RF signal using a reference or local oscillator (LO) signal provided by local oscillator 115. For example, in at least one operational mode of receiver 116, frequency mixer 124 translates the RF signal frequencies to baseband frequencies centered at DC (i.e., zero-intermediate frequency (ZIF) in a ZIF mode of operation). In another operational mode, receiver 116 is configured as a low-intermediate frequency (LIF) receiver (i.e., in a LIF mode of operation) and frequency mixer 124 translates the RF signal to a low-intermediate frequency (e.g., 100-200 kHz) to avoid DC offset and 1/f noise problems of ZIF receivers.

Frequency mixer 124 provides the translated output signal as a set of two signals, an in-phase (I) signal, and a quadrature (Q) signal. The I and Q signals are analog time-domain signals. In at least one embodiment of receiver 116, the analog amplifiers and filters 128 provide amplified and filtered versions of the I and Q signals to analog-to-digital converter (ADC) 130, which converts those versions of the I and Q signals to digital I and Q signals (i.e., I and Q samples). Exemplary embodiments of ADC 130 use a variety of signal conversion techniques (e.g., delta-sigma (i.e., sigma-delta) analog to digital conversion). ADC 130 provides the digital I and Q signals to signal processing circuitry 132. In general, signal processing circuitry 132 performs processing (e.g., demodulation, frequency translation (e.g., using mixer 131), filtering, or signal correction) of the digital I and Q signals. In at least one embodiment, signal processing circuitry 132 includes demodulator 141, which retrieves or extracts information from digital I and Q signals (e.g., data signals, that were modulated by a transmitter (not shown) and provided to antenna 101 as RF signals). In at least one embodiment, one or more circuits of signal processing circuitry 132 converts digital I and Q signals from a Cartesian representation into polar representation (i.e., instantaneous phase and instantaneous amplitude) for use by frequency correction circuit 142 or phase averaging circuit 143. In at least one embodiment, signal processing circuitry 132 (described further below) generates at least one correction value for application to local oscillator 115 or other circuit of receiver 116.

In at least one embodiment, signal processing circuitry 132 provides information, such as the demodulated data or phase measurements, to data processing circuitry 138. Data processing circuitry 138 may perform a variety of functions (e.g., logic, arithmetic, etc.). For example, data processing circuitry 138 may use the demodulated data in a program, routine, or algorithm (whether in software, firmware, hardware, or a combination thereof) to perform desired control or data processing tasks. In at least one embodiment, data processing circuitry 138, which includes memory 136, controls other circuitry, sub-system, or systems (not shown).

Figure 3:
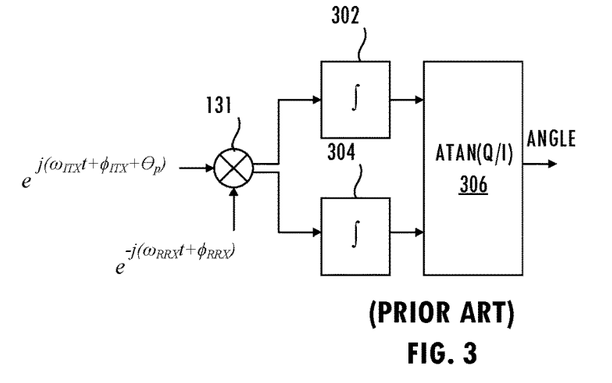
FIG. 3 illustrates a functional block diagram of an exemplary angle measurement technique including integration of samples prior to an angle computation for use in a distance measurement by a wireless communications device.

In at least one embodiment, phase averaging circuit 143 or other circuit within signal processing circuit 132 computes a phase value (i.e., an angle value) for each pair of filtered, versions of digital I and Q signals received from digital filters 140 during a measurement interval of receiver operation and generates a phase measurement for a phase measurement interval. The phase measurement interval can have different values by negotiation between the initiator and reflector. In an exemplary embodiment, a phase measurement interval of 80 µs is used. This interval is relatively long enough to include averaging of measurements that increase accuracy of the phase measurements used for distance measurements. FIG. 3 illustrates an exemplary prior art technique for computing a phase measurement by integrating digital I and Q baseband (ZIF) signals (e.g., averaging N I samples and N Q samples, where N is an integer greater than one indicating the number of samples in a measurement interval) using corresponding integrator circuits 302 and 304 during the measurement interval and then providing the integrated digital I signal and the integrated digital Q signal to arctangent circuit 306, which computes a single angle measurement that is the arctangent of the integrated digital Q signal divided by the integrated digital I signal. The integrating suppresses noise and frequency offset prior to computation of the angle measurement. In at least one embodiment of the receiver, the technique of FIG. 3 is adequate to meet specifications in systems having a low frequency offset (e.g., a frequency offset of ±4 ppm). However, in environments that have greater frequency offsets (e.g., a system including an initiator and a reflector that have frequency offsets up to 80 ppm), errors of ±π (i.e., 3.14159 radians) occur. To achieve 0.5 m accuracy of a corresponding distance measurement, the sum of phase errors from all sources must be less than 0.1 radians, thus improved techniques for performing phase measurements are desired.

Figure 4:
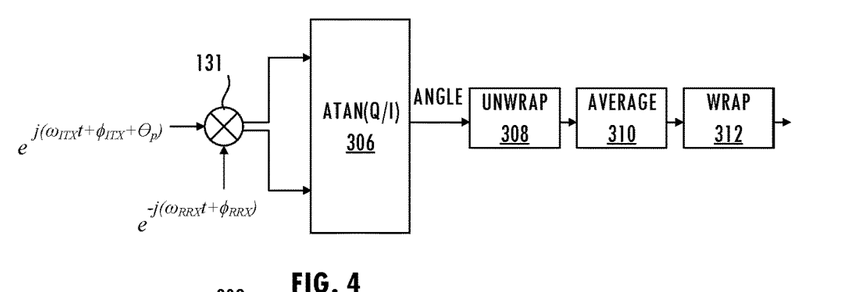
FIG. 4 illustrates a functional block diagram of an exemplary angle measurement technique including averaging of computed angles for use in a distance measurement by a wireless communications device consistent with at least one embodiment of the invention.

FIG. 4 illustrates a technique that performs phase measurement with improved signal-to-noise ratios as compared to phase measurement using the technique of FIG. 3 and reduces or eliminates errors due to phase boundary transitions. Arctangent circuit 306 computes N phase values based on NI and Q baseband (ZIF) samples during the measurement interval (e.g., 80 μsec). In at least one embodiment of a wireless communications system, the local oscillator operates at 2.4 GHz, the wavelength is approximately 12 cm, and the phase delay between the initiator transmitter LO and the reflector receiver LO increases (i.e., accumulates) over the interval due to frequency offset. The accumulated phase delay is proportional to distance and it may be necessary to unwrap the phase response to ensure that all appropriate multiples of $2\pi$ are included in the sum. Unwrap circuit 308 counts the number of cycles of $2\pi$ by detecting a phase jump at the $\pi$ to $-\pi$ boundary in the digital representation of the angle. The cycle count is added to the instantaneous angle to form the unwrapped angle. Averaging suppresses noise and frequency offset after computation of each angle measurement. In at least one embodiment, a target worst-case frequency offset of ±80 ppm at 2.4 GHz corresponds to phase wrapping every 5.2 μsec.

In at least one embodiment, arctangent circuit 306 performs an arctangent function having a range of 0 to $2\pi$ (i.e., all four quadrants). In at least one embodiment, arctangent circuit 306 first computes the angle assuming that the I and Q sample is in the first quadrant (e.g., angle=arctan(abs(Q)/abs(I)). Next, arctangent circuit 306 examines the sign of the Q sample and the sign of the I sample to place the wrapped angle in the proper quadrant (first, second, third, or fourth) by adding the corresponding multiples of $\pi$ to the angle computed assuming that both the Q sample and the I sample are positive. Arctangent circuit 306 provides wrapped angle values. Unwrap circuit 308 observes the wrapped input angle values and adds $2\pi$ to an input angle value as needed to unwrap that input angle value. In general, wrapped angles refer to angle values that are contained to the range between $-\pi$ and $\pi$ radians. Unwrap circuit 308 provides unwrapped angle values to averaging circuit 310. In general, an unwrap circuit adds appropriate multiples of a to each angle input to restore original phase values. In at least one embodiment, unwrap circuit 308 adds M×2×$\pi$ to the angle value. Averaging circuit 310 averages N unwrapped angle values, where N is the number of samples in the averaging interval, and provides the average angle value to wrap circuit 312. In at least one embodiment, wrap circuit 312 performs a modulo $2\pi$ operation on the average value to provide a wrapped average angle value between $-\pi$ and it or between 0 and $2\pi$. In at least one embodiment, average circuit 310 accumulates angle values using a fixed-point representation of a single binary word having an integer portion and a fractional portion. The integer portion represents the number of cycles of $2\pi$ and the fractional portion represents the residual phase. The accumulated fixed-point representation is truncated to the fractional portion to wrap the angle back between $-\pi$ and $\pi$. This technique results in reduced phase measurement errors as compared to the technique of FIG. 3. The approach of FIG. 4 achieves a higher signal-to-noise ratio measurement, increased tolerance to frequency errors between the initiator and the reflector, and does not result in erroneous phase measurements since phase wrapping is taken into account.

Figure 5:
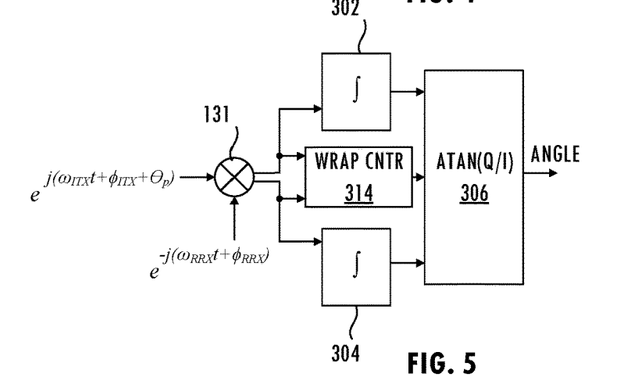
FIG. 5 illustrates a functional block diagram of an exemplary angle measurement technique including integration of samples prior to an angle computation and tracking of phase wrapping for use in a distance measurement by a communications device consistent with at least one embodiment of the invention.
Figure 6:
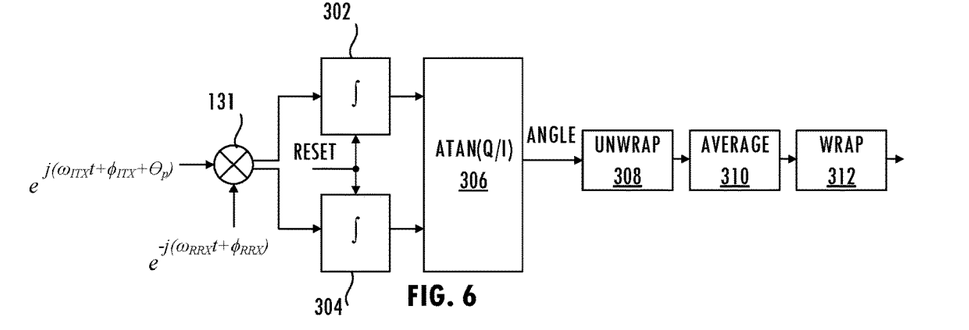
FIG. 6 illustrates a functional block diagram of an exemplary angle measurement technique that integrates samples over an interval that avoids phase wrapping and averages computed angles for use in a distance measurement by a wireless communications device consistent with at least one embodiment of the invention.

Hybrid variations of the techniques of FIGS. 3 and 4 are illustrated in FIGS. 5 and 6. The techniques of FIGS. 5 and 6 provide the digital I and Q signals to integrator 302 and integrator 304, respectively, which integrate the digital I and Q signals before the arctangent computation. Similarly to the technique of FIG. 3, the technique of FIG. 5 performs a single angle computation. Unlike the technique of FIG. 3, which ignores wrapping, the technique of FIG. 5 monitors the signs of the digital I and Q signals to detect when the samples wrap around $2\pi$ and alleviates potentially large errors that may result from that wrapping. However, the noise filtering properties are inferior to the noise filtering properties of the technique of FIG. 4.

FIG. 6 illustrates a technique that integrates P samples of the digital I and Q signals before performing the angle calculation, thus performing N/P angle computations as compared to N angle computations of the technique of FIG. 4. The technique of FIG. 6 uses a reset signal to implement an integrate and dump operation of I and Q samples, followed by a series of phase values and corresponding average of those phase values over an interval (e.g., 4 μsec) that is a fraction of the measurement interval to prevent wrapping, and to reduce the number of arctangent computations. Integrators 302 and 304 integrate P I and Q samples (e.g., 10, which is a fraction of the number of phase values made during a phase measurement interval) and provide N/P integrated I and Q samples to arctangent circuit 306, followed by unwrap circuit 308 and averaging circuit 310, which averages the N/P unwrapped phase values. Wrap circuit 312 generates a phase measurement based on the average unwrapped phase value. This technique reduces the number of arctangent computations needed and reduces error as compared to the technique of FIG. 3.

In at least one embodiment, arctangent circuit 306 is implemented using a COordinate Rotation DIgital Computer (CORDIC), which may be dedicated to the phase measurement implementation or shared with other operations of the receiver. In general, a CORDIC implements known techniques to perform calculations, including trigonometric functions and complex multiplies, without using a multiplier. The only operations the CORDIC uses are addition, subtraction, bit-shift, and table-lookup operations to implement the arctangent function. In other embodiments, a digital signal processor executing firmware or an arctangent circuit is used. In at least one embodiment, the communications system stores the resulting angle measurements in memory for use in distance calculations. In at least one embodiment, the communications system applies a phase correction term (PCT) to the resulting angle measurements and stores the phase corrected angle measurements in memory for use in distance measurements.

Referring to FIG. 1, in general, the PCT is applied to received samples to compensate for the propagation delay between the initiator antenna and the reflector antenna. In at least one embodiment, the PCT is characterized at the antenna although signals are observed at different points in the receiver path. $PCT_R$ is applied to received samples at the reflector to compensate for the propagation delay $t_p$ between the initiator antenna and the reflector antenna. Similarly, $PCT_I$ is applied to received samples at the initiator to compensate for the propagation delay $t_p$ between the initiator antenna and the reflector antenna. For example:

$$PCT_R(t)=2\pi(f_{initiator}-f_{reflector})t_{reflector}+2\pi f_{reflector}t_p+\theta_{initiator}-\theta_{reflector}+n_{reflector}(t), \text{ and}$$

$$PCT_I(t)=2\pi(f_{reflector}-f_{initiator})t_{initiator}+2\pi f_{initiator}t_p+\theta_{reflector}-\theta_{initiator}+n_{initiator}(t).$$

In at least one embodiment of wireless communications system 100, the PCT measurements are:

$$PCT_R = \sum \frac{PCT_R(nT_s)}{N} =$$
$$\sum [2\pi(f_{initiator} - f_{reflector})nT_s + 2\pi f_{reflector}t_p + \theta_{initiator} -$$
$$\theta_{reflector} + n_{reflector}nT_S]/N;$$

$$PCT_I = \sum \frac{PCT_I(nT_s)}{N} = \sum [2\pi(f_{reflector} - f_{initiator})nT_s +$$
$$2\pi f_{initiator}t_p + \theta_{reflector} - \theta_{initiator} + n_{initiator}nT_S]/N.$$

Under ideal conditions, $PCT_R = PCT_I$ and the noise terms for both average to negligible values. Thus, $$PCT_R + PCT_I = 2\pi f_{reflector}t_p + 2\pi f_{initiator}t_p.$$

The phase measurements at the initiator and reflector must use the same amount of time for cancellation of $$2\pi(f_{initiator} - f_{reflector})t_{reflector} + 2\pi(f_{initiator} + f_{reflector})t_{initiator}.$$

However, if the initiator and reflector frequencies are mismatched, the frequency offset between the frequency of the reflector local oscillator and the frequency of the initiator local oscillator (i.e., $f_{EST} = f_{reflector} - f_{initiator}$) must be estimated and compensated making the measurement time less relevant:

$$2\pi(f_{reflector} - f_{initiator} - f_{EST})t_{initiator} = 0.$$

Figure 7:
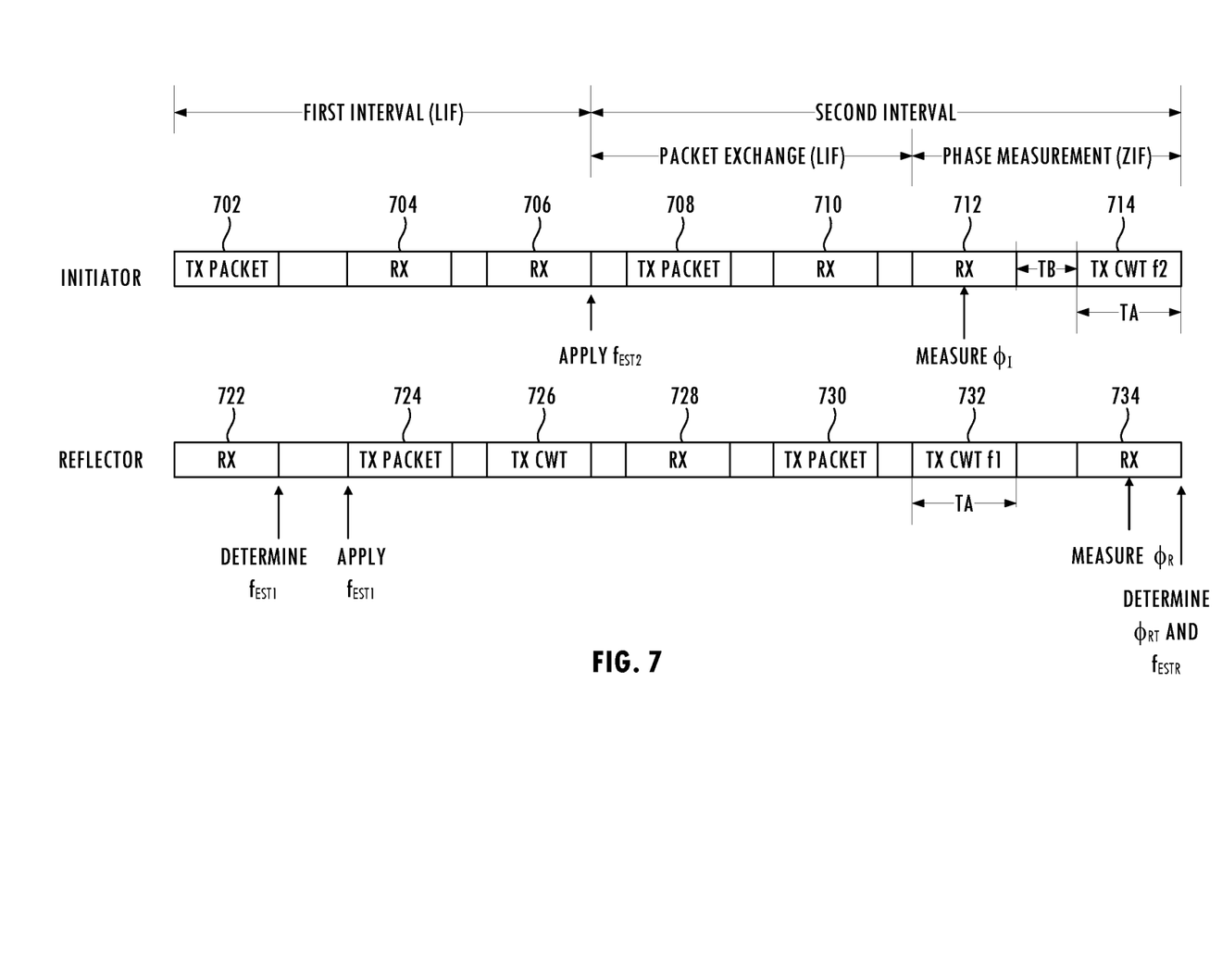
FIG. 7 illustrates exemplary timing diagrams of communications between wireless communications devices used in a distance measurement consistent with at least one embodiment of the invention.

Referring to FIGS. 1 and 7, in at least one embodiment, wireless communications system 100 implements a BLE communications protocol that performs frequency compensation at the initiator to reduce the frequency offset (i.e., $f_{initiator} - f_{reflector}$) between the frequency of the initiator local oscillator and the frequency of the reflector local oscillator. However, implementation of frequency compensation by an initiator manufactured by another vendor may be inadequate to reduce the frequency offset to a level that provides distance measurements within target accuracy specifications (e.g., ±4 ppm). Accordingly, in at least one embodiment of wireless communications system 100, the reflector implements a frequency compensation technique that occurs during a frequency compensation interval of an electronic handshake process performed by communications devices to establish communications compliant with a target communications protocol.

Although wireless communications device 102 is configured as an initiator that performs frequency compensation during a first interval (e.g., a frequency compensation interval), wireless communications device 112, which is configured as a reflector, also performs frequency compensation during the first interval, but prior to the initiator frequency offset compensation. During the first interval, wireless communications system 100 operates the receiver in LIF mode. The initiator transmits a packet during initiator interval 702 and the reflector receives that packet during reflector interval 722. The reflector determines frequency offset $f_{EST}$ and generates an associated adjustment value during reflector interval 722 using a portion of the packet received from the initiator. An exemplary packet format includes a preamble having a predefined data pattern that a receiver can use to detect and settle its control loops, e.g., an eight-bit sequence of alternating ones and zeros, and a payload with length of zero. In at least one embodiment, the packet includes a preamble, a 32 bit sync word, e.g., PN sequence pn[31:0], and a 96 bit sounding sequence. In an embodiment the PN sequence is a 32-bit Pseudo-Noise sequence also referred to as a Pseudo-Random Binary Sequence (PRBS) that is known to both the initiator and reflector. In an embodiment the sync word is an address or other identifier associated with the receiver that marks the beginning of the sounding sequence. In other embodiments, the reflector determines frequency offset $f_{EST}$ based on a packet received in the ZIF mode of operation.

The reflector determines a frequency offset using sequential samples of the preamble, the sync word, or combination thereof, and applies an adjustment based on that frequency offset to the reflector local oscillator 115. That adjustment is effective for the transmission of a packet during reflector interval 724 and the remainder of the first interval and at least during a second interval used to perform distance measurements (e.g., an interval including a packet exchange subinterval and a phase measurement subinterval). The initiator receives that packet during initiator interval 704, followed by a continuous wave tone, which is transmitted by the reflector during reflector interval 726 and received during initiator interval 706. In an exemplary embodiment of wireless communications system 100, the packet and the continuous wave tone received by the initiator in interval 704 and initiator interval 706, respectively, will have a reduced frequency offset (e.g., a frequency offset of 5 kHz or less). The initiator uses the received packet and the received continuous wave tone to determine frequency offset $f_{EST2}$ (e.g., using an estimation technique described herein, or other technique for estimating frequency offset), and applies an associated adjustment to initiator local oscillator 105, if needed.

During the second interval of FIG. 7, the reflector compensates for the frequency offset between the initiator and reflector to a negligible value that makes the measurement starting point and duration of the PCT irrelevant. In an exemplary embodiment of wireless communications system 100, the second interval includes a packet exchange subinterval and a phase measurement subinterval. In the packet exchange subinterval, the initiator transmits a packet during initiator interval 708 and the reflector receives that packet during reflector interval 728. Similarly, the reflector transmits a packet during reflector interval 730, and the initiator receives that packet during initiator interval 710. In other embodiments of wireless communications system 100, the packet exchange subinterval is omitted.

In at least one embodiment, wireless communications system 100 includes a ZIF mode of operation, which is used during the phase measurement subinterval. In the ZIF mode of operation, the initiator and reflector communicate baseband intermediate frequency (i.e., ZIF) signals. Since baseband signals are at or near DC, the ZIF mode reduces or eliminates a phase shift of the received signals through baseband circuits, ADC, and digital filters, that could affect distance measurements based on phase measurements. Thus, the phase shift through those circuits need not be known or calibrated and the use of the ZIF mode of operation simplifies the phase measurements. In at least one embodiment of wireless communications system 100, the reflector transmits continuous wave tone $CWT_{f1}$ during reflector interval 732 and the initiator measures phase $\phi_I$ using a received version of continuous wave tone $CWT_{f1}$ during initiator interval 712. Similarly, the initiator transmits continuous wave tone $CWT_{f2}$ during initiator interval 714 and the reflector measures phase $\phi_R$ using a received version of continuous wave tone $CWT_{f2}$ during reflector interval 734. Wireless communications system 100 repeats the phase measurements for additional values of i, where 1≤i≤I (e.g., I=70 and corresponds to 70 spaced carriers over an 80 MHz channel at 2.4 GHz). In at least one embodiment of wireless communications system 100, the reflector determines a residual frequency offset $f_{ESTR}$ using the version of continuous wave tone $CWT_{fi}$ received in the ZIF mode. In addition, an adjustment based on the residual frequency offset is applied to the PCT at the input of the demodulator to compensate for a frequency rotation of the phase correction value. The initiator determines a roundtrip phase $\phi_{RT}$ after the second interval.

In the ZIF mode of operation, self-mixing can cause a DC offset that is a substantial source of error. In an exemplary embodiment of wireless communications system 100, analog I and Q signals have levels of approximately 20 mV peak-to-peak with a received signal close to the sensitivity level. The residual DC offset is specified to be much less than 1 mV DC to reduce or eliminate phase error due to the DC offset shifting the I and Q signals. Since information is communicated at DC in the ZIF mode of operation, conventional techniques for attenuating DC offset (e.g., high pass filtering using a series AC coupling capacitor) are not feasible. In at least one embodiment, wireless communications system 100 includes a calibration mode of operation that estimates the DC offset, generates DC offset compensation values, and stores those DC offset compensation values in storage elements for later use during a normal mode of operation.

Figure 8:
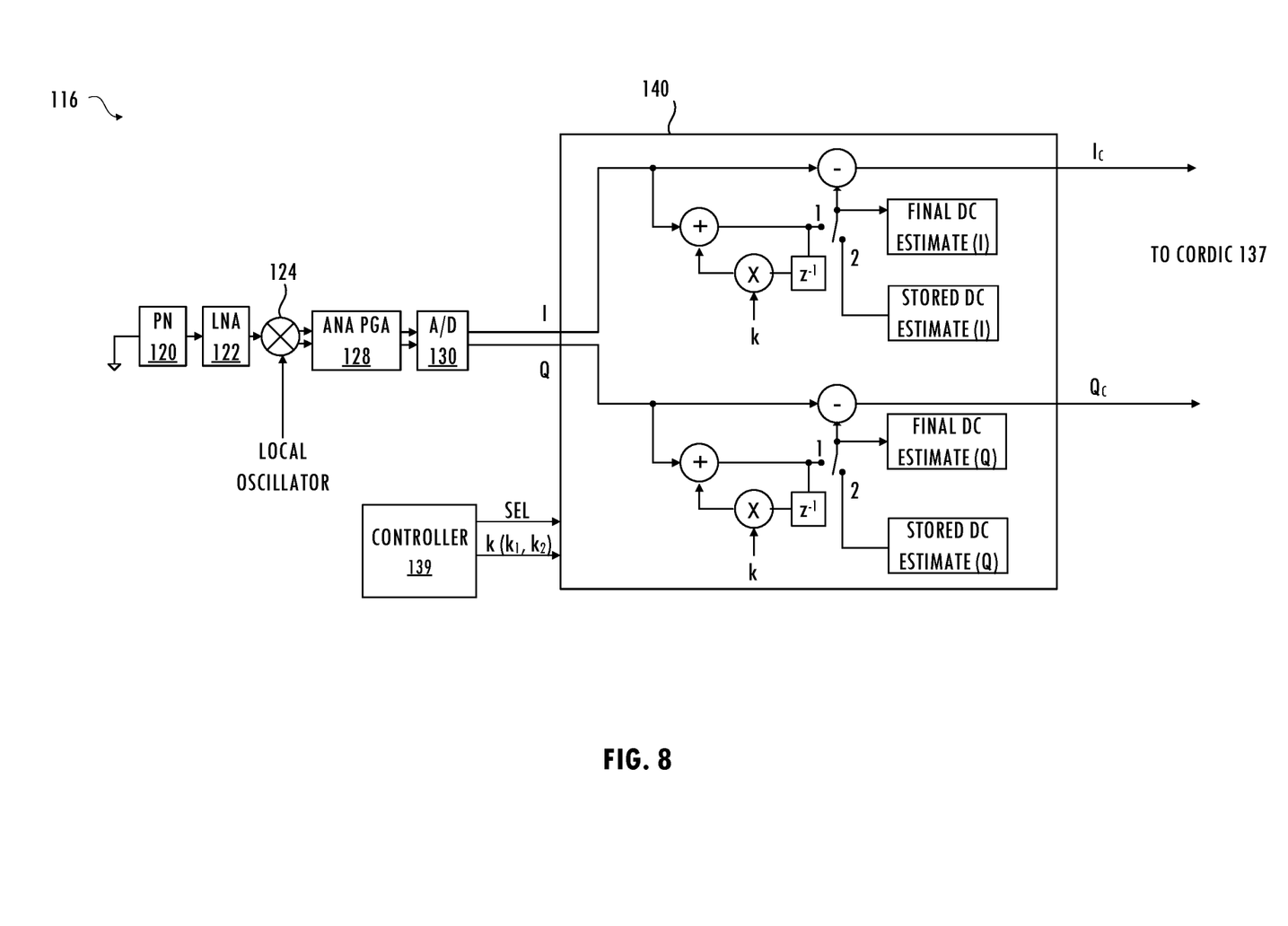
FIG. 8 illustrates a functional block diagram of portions of an exemplary receiver used to estimate and compensate for a DC offset in signals used in a distance measurement consistent with at least one embodiment of the invention.

FIG. 8 illustrates receiver 116 configured in a calibration mode of operation in which the receiver input is coupled to a reference node (e.g., ground) to null the receiver input signal. In the calibration mode of operation, receiver 116 is also configured in the ZIF mode of operation. In at least one embodiment of digital filters 140, during the calibration mode of operation, the switches are configured in position 1, causing the low-pass filter output to be subtracted from the input signal. After a predetermined amount of time, controller 139 stores the FINAL DC ESTIMATE for later use during a normal mode of operation. In at least one embodiment, analog circuits (e.g., a programmable gain amplifier or analog-to-digital converter) have multiple settings and controller 139 configures receiver 116 to estimate the DC offset for each setting of the analog circuits and stores each estimate in a corresponding storage element or memory location (e.g., in a lookup table).

In at least one embodiment of digital filters 140, in the calibration mode of operation, while computing the low-pass filter output, controller 139 configures the switches in position 1 to couple the difference node to receive the corresponding current low-pass filter output value. While computing an updated value of the low-pass filter output, the corresponding digital signal is compensated by the current low-pass filter output value and controller 139 compares that compensated value (e.g., the output of the difference node) to a predetermined value (e.g., 0). If the difference is less than or equal to the predetermined value, the controller causes the low-pass filter output to be stored as the FINAL DC ESTIMATE for later use during a normal mode of operation. In at least one embodiment, analog circuits (e.g., a programmable gain amplifier or analog-to-digital converter) have multiple settings and controller 139 configures receiver 116 to estimate the DC offset for each setting of the analog circuits and stores each estimate in a corresponding storage element or memory location (e.g., in a lookup table).

In at least one embodiment, for each setting of the analog circuits, controller 139 first operates the low-pass filter using a first coefficient (e.g., k=$k_1$) to cause the low-pass filter to have a first time constant of the low-pass filter, and after a predetermined number of samples controller 139, updates the low-pass filter to use a second coefficient (e.g., k=$k_2$) to cause the low-pass filter to have a second time constant, where the second time constant is longer than the first time constant (e.g., $|k_1|>|k_2|$) to expedite convergence of the low-pass filter output values. In an alternate embodiment, controller 139 starts the low-pass filter configured to operate with the first time constant of the low-pass filter and in response to the compensated signal being below a threshold value (i.e., indicating convergence) controller 139, changes the value of k to second value $k_2$ associated with a second time constant of the low-pass filter. In at least one embodiment, additional values of k are used to further control the DC estimate convergence. The low-pass filters can be single-pole infinite impulse response low-pass filter circuits, moving average circuits, or other finite impulse response low pass filter circuits or infinite impulse response low pass filter circuits of varying order.

After calibration mode is completed for each setting of the analog circuit, in a normal mode of operation in which receiver 116 is configured in the ZIF mode of operation, controller 139 configures switches in position 2 to couple a STORED DC ESTIMATE corresponding to an active setting of the analog circuit (e.g., an active setting of the PGA) to corresponding difference nodes to compensate for the DC offset in the digital I and Q signals received by digital filters 140. For example, in a ZIF mode of the normal mode of operation, the estimates of the DC offset is subtracted from the digital I and Q signals and the differences are provided as DC offset compensated digital I and Q signals (i.e., $I_C$ and $Q_C$) to CORDIC 137 or other digital processing circuit for further processing. In a normal mode of operation in which receiver 116 is configured in the LIF mode of operation, controller 139 configures switches in position 1 and the digital filters 140 are configured as high pass filter that blocks DC for LIF mode of operation.

Figure 9:
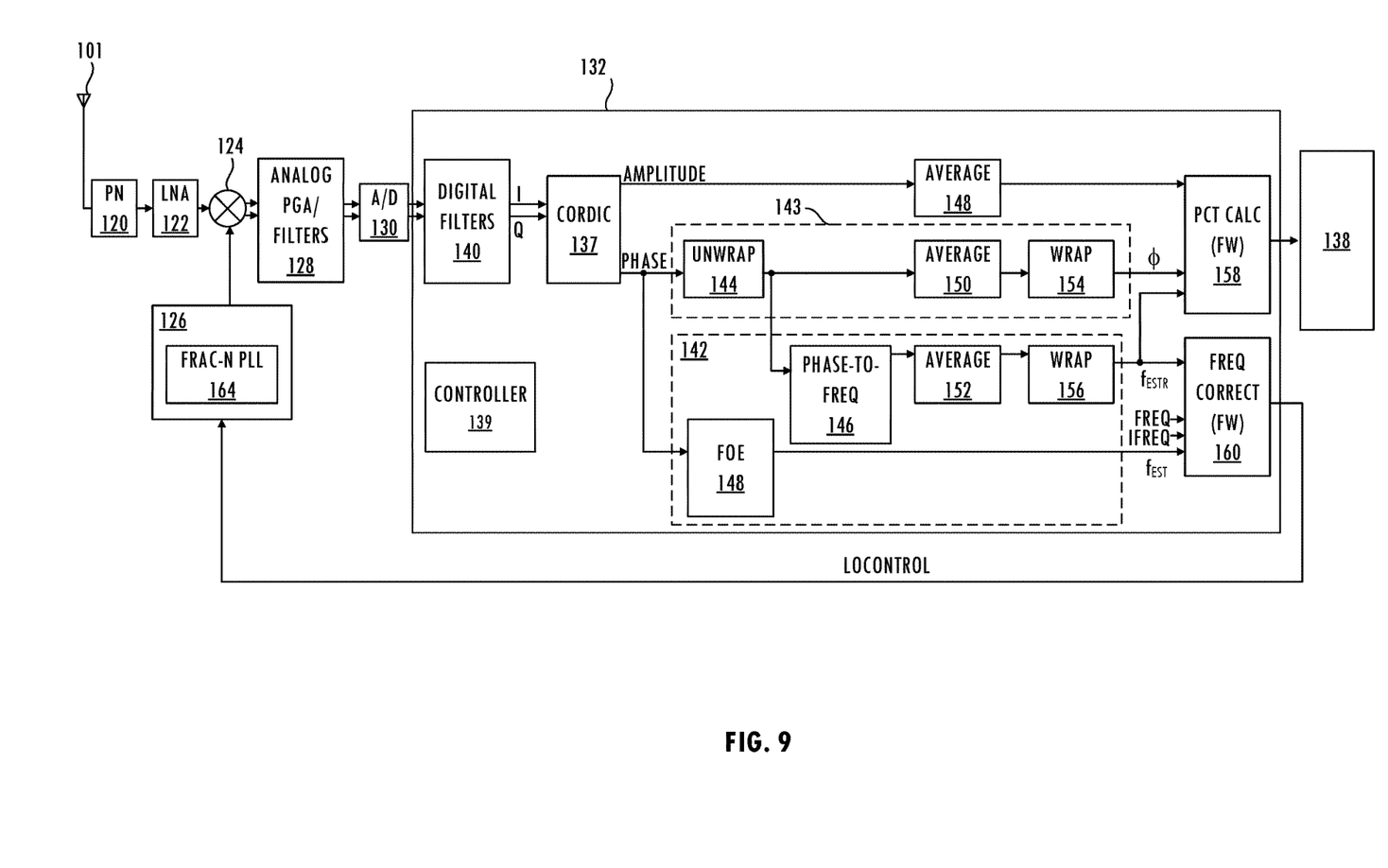
FIG. 9 illustrates a functional block diagram of portions of an exemplary receiver used to measure phase and to measure and compensate for frequency offset in signals used in a distance measurement consistent with at least one embodiment of the invention.

Referring to FIG. 9, in at least one embodiment, receiver 116 implements phase measurements consistent with the technique described with reference to FIG. 4. In addition, receiver 116 estimates frequency offset $f_{EST}$ and residual frequency offset $f_{ESTR}$ and those operations share CORDIC 137. In at least one embodiment, CORDIC 137 receives samples (e.g., filtered, versions of digital I and Q signals) from digital filters 140 and converts the digital I and Q signals from a Cartesian representation into a polar representation using the Pythagorean theorem to compute the amplitude (e.g., amplitude=$\sqrt{I^2+Q^2}$) and an arctangent operation (e.g., arctan (Q/I)) to compute the phase values used by frequency correction circuit 142 and phase averaging circuit 143 to compute frequency offset estimate $f_{EST}$, residual frequency offset estimate $f_{ESTR}$, and phase measurement $\phi$.

In at least one embodiment, receiver 116 is configured in a normal mode of operation as a ZIF receiver including phase averaging circuit 143 which averages phase measurements during a phase measurement interval, as described above. Unwrap circuit 144 receives the phase values, adds/subtracts M×2×π, to the phase values to generate the unwrapped phase values, and provides the unwrapped phase values to averaging circuit 150. The unwrap circuit counts the number of π/-π boundary crossings to determine the cycle count M. Averaging circuit 150 averages N unwrapped phase values, where N is an integral number of samples in a measurement interval. Averaging circuit 150 provides the average, unwrapped value to wrap circuit 154. Wrap circuit 154 performs a modulo 2π operation on the average, unwrapped value to provide a wrapped phase measurement φ to PCT circuit 158. In at least one embodiment, wrap circuit 154 wraps the phase to be within a digital representation of ±π. PCT circuit 158 applies frequency and delay corrections to phase measurement φ to calculate the phase correction term consistent with the PCT described above. In at least one embodiment, the reflector stores the corrected phase measurement for use in a distance measurement performed by data processing circuitry 138. In other embodiments, the reflector transmits the phase-corrected phase measurement to the initiator for use in a distance measurement computed at the initiator.

In at least one embodiment, in a normal mode of operation receiver 116 is selectively configured as an LIF receiver (e.g., a digital mixer, not shown, is active in the receiver path) or a ZIF receiver. Frequency offset estimator 148 receives phase values from CORDIC 137 and generates frequency offset estimate $f_{EST}$ (i.e., $f_{EST}=f_{repector}-f_{initiator}$). For example, frequency offset estimator 148 differentiates the phase output of the CORDIC by computing discrete time phase difference values (e.g., φ[n]−φ[n−1]=$f_x$). Frequency offset estimator 148 subtracts a value corresponding to an expected phase difference value, which is predetermined and stored in memory, from the incoming discrete time phase difference values, accumulates the error, and divides by a predetermined number of symbols (e.g., 8≤N≤32 symbols) to form an estimate of the frequency error. The expected phase difference values are based upon the specified frequency deviation $f_{DEV}$ for the physical layer (e.g., ±250 kHz).

For example, for frequency shift keying, when transmitting a '1,' the transmitter transmits a radio frequency tone having frequency $f_{RF}+f_{DEV}$, and when transmitting a '0,' the transmitter transmits a tone having frequency $f_{RF}-f_{DEV}$. In an exemplary embodiment that uses the eight symbols of the preamble to estimate the frequency error, expected values $ξ_1$, $ξ_2$, $ξ_3$, $-ξ_1$, $-ξ_2$, $-ξ_3$, which correspond to the expected instantaneous frequency deviation (i.e., the phase difference over a symbol) are stored in memory. Values of $ξ_1$, $ξ_2$, and $ξ_3$ vary with the system BT parameter (e.g., bandwidth×bit time=0.5), which determines the effects of transmitter pulse shaping, and receiver filtering bandwidth. In at least one embodiment, effects of filtering in the receiver and transmitter pulse shaping from one bit can affect subsequent bits, which is known as Inter-Symbol Interference (ISI). If sequential symbols include a relatively long run of '1's, the full frequency deviation is expected (e.g., $ξ_1$). If sequential symbols alternate between '1' and '0', the expected frequency deviates less than the full frequency deviation due to effects of the filtering (e.g., ±$ξ_3$). Each expected value corresponds to a different data pattern of three bits (i.e., $b_n$, $b_{n-1}$, and $b_{n-2}$). Exemplary values of $ξ_1$, $ξ_2$, and $ξ_3$ correspond to expected deviations $f_{DEV}$ of 250 kHz, 173 kHz, and 92 kHz, respectively, after receiver filtering. However, the expected deviations will vary according to characteristics of filtering implemented in the receiver. If sequential symbols include a relatively long run of '1's, the full frequency deviation (e.g., 250 kHz) is expected and if an exemplary transmitter has an offset of 50 kHz, then the transmitted signal has a frequency of $f_{RF}+f_{DEV}+50$ kHz. Accordingly, frequency offset estimator 148 would compute the average frequency offset value as follows:

$$\frac{1}{N}\sum_{i=0}^{N-1}|f_x - f_{expected}| = \frac{1}{N}\sum_{i=0}^{N-1}|300 \text{ kHz} - 250 \text{ kHz}| = 50 \text{ kHz}.$$

Frequency offset estimator 148 provides an average frequency offset value as frequency offset estimate $f_{EST}$ to frequency correction circuit 160 once per packet. In at least one embodiment, frequency correction circuit 160 generates a frequency adjustment value based on the frequency offset estimate $f_{EST}$ (e.g., by negating the average frequency offset value) and combines it with other control values (FREQ or IFREQ) to generate LOCONTROL. For example, LOCONTROL controls local oscillator 126 (e.g., controls a fractional-N phase-locked loop 164) so that the reflector local oscillator frequency matches the initiator local oscillator frequency within a target specification (e.g., ±4 ppm).

In at least one embodiment, while receiver 116 is configured as a ZIF receiver receiving a continuous wave tone having the frequency of the initiator local oscillator, unwrap circuit 144 is shared with frequency correction circuit 142 and provides the unwrapped phase values to phase-to-frequency circuit 146, which generates frequency estimates based on the unwrapped phase values (e.g., by computing discrete time phase difference values (e.g., φ[n]−φ[n−1])). If the initiator local oscillator is perfectly matched to local oscillator 126, then the output of mixer 124 is a DC signal and the output of phase-to-frequency circuit 146 is zero. If the initiator local oscillator and the reflector local oscillator are mismatched, then the output of mixer 124 is not a DC signal, and the frequency estimate output of phase-to-frequency circuit 146 is an estimate of the residual frequency offset between the initiator local oscillator and the reflector local oscillator. In at least one embodiment of phase-to-frequency circuit 146, rather than using adjacent unwrapped phase values, phase-to-frequency circuit 146 computes discrete time phase difference values using non-adjacent unwrapped phase values (e.g., φ[n]−φ[n−2]) to improve accuracy. Using non-adjacent values improves accuracy by increasing the expected phase difference above the quantization limit of the system. Phase-to-frequency circuit 146 provides the frequency offset estimates to averaging circuit 152, which averages N values and provides the average phase difference (i.e., the average frequency, e.g., the average frequency offset when receiver 116 is receiving a continuous wave tone having the frequency of the initiator local oscillator) to wrap circuit 156. Wrap circuit 156 wraps that average phase difference (i.e., frequency error) to be within the limits of the output format (e.g., to within ±400 kHz). In an exemplary embodiment, the average frequency offset will not exceed the limits of the output format since the frequency correction applied based on frequency offset estimate $f_{EST}$ brings the frequency offset within a narrower range (e.g., 15 kHz). Excess margin accommodates a maximum tolerated frequency drift (e.g., 20 Hz/μsec). Wrap circuit 156 provides a wrapped average frequency value as residual frequency offset estimate $f_{ESTR}$ to frequency correction circuit 160. In some embodiments, wrap circuit 156 provides residual frequency offset estimate $f_{ESTR}$ to PCT circuit 158, which converts residual frequency offset estimate $f_{ESTR}$ to radians based on the measurement period (e.g., $f_{ESTR}×½$ the period of interval 734 of FIG. 7). Referring back to FIG. 9, although frequency correction circuit 142 is described in an embodiment that generates residual frequency offset estimate $f_{ESTR}$ while receiver 116 is configured in a ZIF mode of operation, in other embodiments, frequency correction circuit 142 generates residual frequency offset estimate $f_{ESTR}$ while receiver 116 is configured in a LIF mode of operation (e.g., during frequency compensation performed in interval 728 of FIG. 7). Referring back to FIG. 9, in at least one embodiment, frequency correction circuit 160 uses the residual frequency offset estimate $f_{ESTR}$ as a frequency compensation value. In at least one embodiment, frequency correction circuit 160 generates a frequency compensation value based on the residual frequency offset estimate $f_{ESTR}$.

In at least one embodiment, frequency correction circuit 160 combines a compensation value based on the residual frequency offset estimate $f_{ESTR}$ with another compensation value based on the frequency offset estimate $f_{EST}$ to generate a control signal for adjusting the frequency of local oscillator 126. In at least one embodiment, frequency correction circuit 160 combines residual frequency offset estimate $f_{ESTR}$, when available, with frequency offset estimate $f_{EST}$ to generate control signal LOCONTROL. In some embodiments, frequency correction circuit 160 combines residual frequency offset estimate $f_{ESTR}$, when available, with frequency offset estimate $f_{EST}$ and other parameters that specify a target frequency in ZIF mode or target frequency in LIF mode, to generate digital signal LOCONTROL that determines the frequency of local oscillator 126 (e.g., a digital control signal used to control fractional-N phase-locked loop 164). In at least one embodiment, frequency correction circuit 160 (or other structures described herein) is implemented using software executing on a processor (which includes firmware) or by a combination of software and hardware. Software, as described herein, may be encoded in at least one tangible (i.e., non-transitory) computer readable medium. As referred to herein, a tangible computer-readable medium includes at least a disk, tape, or other magnetic, optical, or electronic storage medium.

Figure 10:
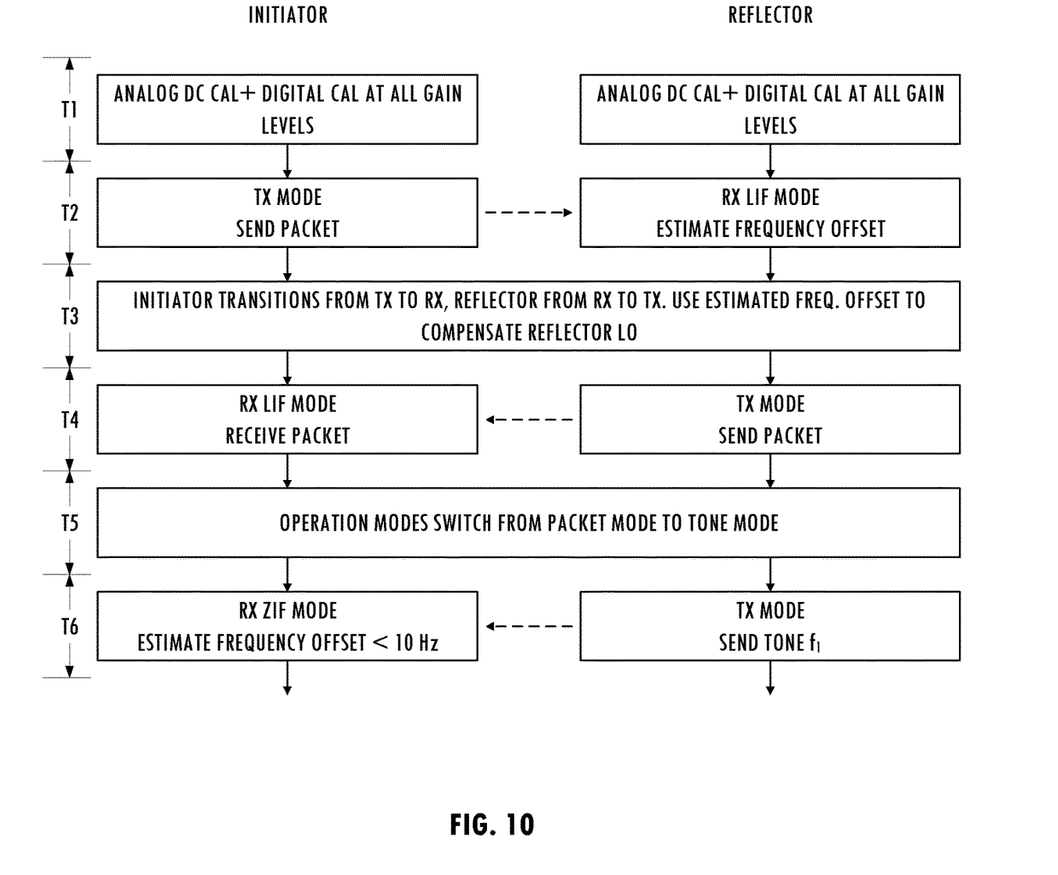
FIG. 10 illustrates exemplary information and control flows for compensating for frequency offset during a frequency compensation interval of communications between wireless communications devices consistent with at least one embodiment of the invention.

Referring to FIG. 1, in at least one embodiment, wireless communications system 100 compensates for frequency offset between wireless communications device 102, which is configured as an initiator operating in a LIF mode, and wireless communications device 112, which is configured as a reflector operating in a LIF mode. In other embodiments of wireless communications system 100, wireless communications device 112 is configured as a reflector and wireless communications device 102 is configured as an initiator and wireless communications system 100 compensates for the associated frequency offset using the sequence of FIG. 10. Referring to FIGS. 1 and 10, during interval T1, receiver 106 of the initiator and receiver 116 of the reflector each generate analog DC offset compensation values for each setting of an analog circuit (e.g., each gain level of a programmable gain amplifier), consistent with techniques described above. After the DC offset compensation, transmitter 104 of the initiator transmits a packet to the reflector operating its receiver in LIF mode. Receiver 116 of the reflector estimates a frequency offset using the preamble of the packet to estimate frequency offset $f_{EST}$ during interval T2. Next, during interval T3, the initiator transitions from a transmitting mode of operation to a receiving mode of operation, the reflector transitions from a receiving mode of operation to a transmitting mode of operation, and the reflector configures its local oscillator (e.g., oscillator 115) to compensate for frequency offset $f_{EST}$. In interval T4, the reflector sends a packet to the initiator using local oscillator 115 compensated for frequency offset $f_{EST}$. The initiator uses that packet to estimate and compensate for a first initiator frequency offset, thereby reducing any frequency offset. The initiator and reflector transition from a packet mode of communication to a continuous wave tone mode of communication in interval T5 and the reflector transmits a continuous wave tone to the initiator in interval T6, which the initiator uses to estimate and compensate for a fine initiator frequency offset, thereby further reducing any frequency offset.

Figure 11:
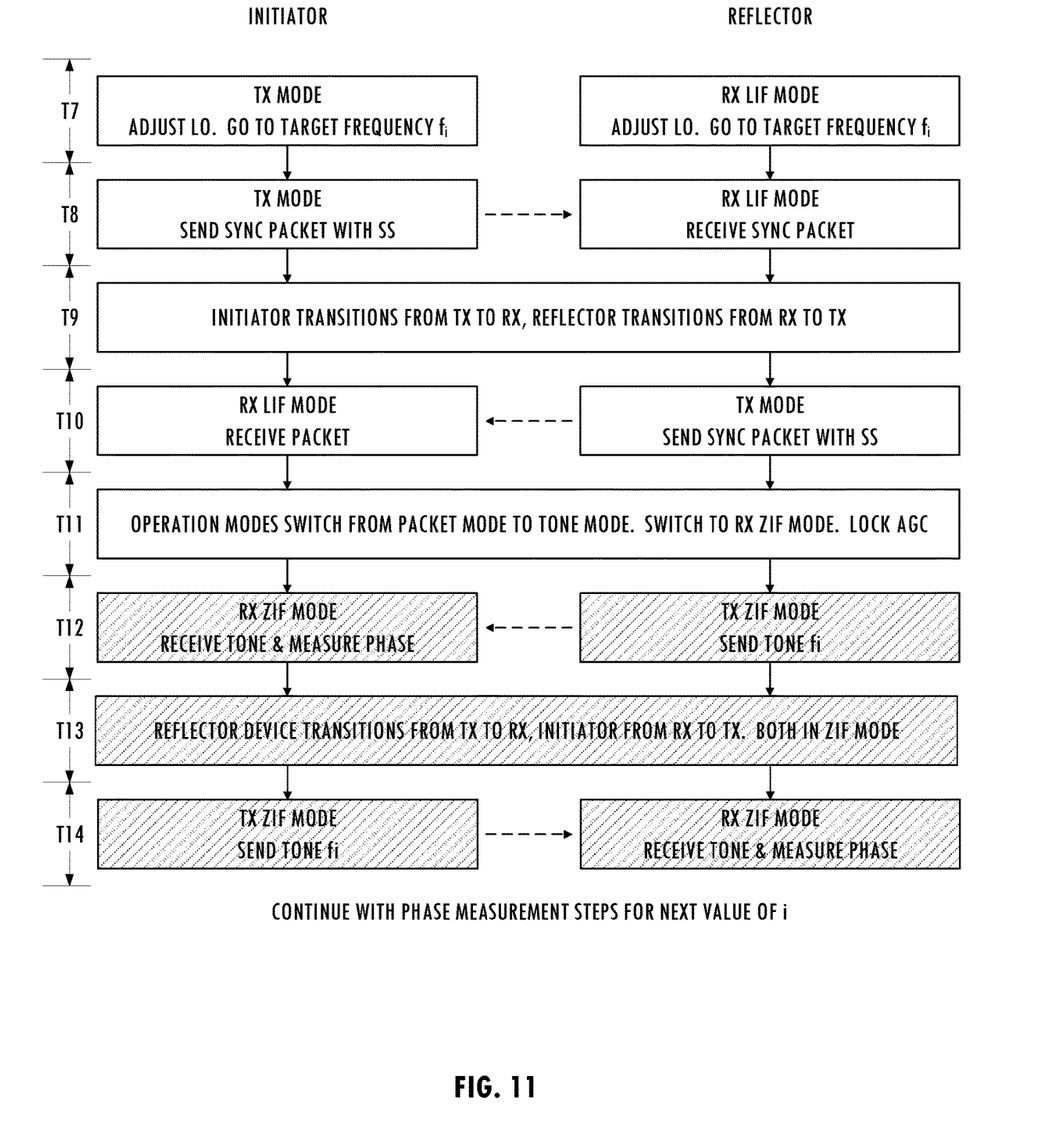
FIG. 11 illustrates exemplary information and control flows for compensating for residual frequency offset and measuring phase using packet exchange and tone exchange communications between wireless communications devices consistent with at least one embodiment of the invention.

In at least one embodiment, after the sequence of intervals T1-T6 in which the initiator and reflector perform frequency estimation and compensation, wireless communications system 100 performs packet exchange and tone exchange communications, which include phase measurements at the initiator and the reflector and residual frequency offset estimation and compensation by the reflector. Referring to FIGS. 1 and 11, during interval T7, the initiator transitions from a receiving mode of operation to a transmitting mode of operation, the reflector transitions from a transmitting mode of operation to a receiving mode of operation, the reflector operates its receiver in LIF mode, and the initiator and the reflector adjust their respective local oscillators to operate at target frequency $f_i$. The initiator transmits a synchronization packet including a sounding sequence or other information, that is received by the reflector in interval T8 and the reflector performs synchronization operations. In interval T9, the initiator transitions from a transmitting mode of operation to a receiving mode of operation and the reflector transitions from a receiving mode of operation to a transmitting mode of operation. The reflector transmits a synchronization packet including a sounding sequence or other information that is received by the initiator in interval T10 and the initiator performs synchronization operations. Next, in interval T11, wireless communications system 100 transitions from packet mode to continuous wave tone mode and from LIF mode of operation to ZIF mode of operation, with the automatic gain control fixed to a predetermined setting.

In interval T12, the reflector transmits a continuous wave tone having a frequency $f_i$, where i is an integer, $1 \le i \le I$, and $I \ge 2$. The initiator receives the continuous wave tone in ZIF mode of operation and measures phase, as described above. Wireless communications system 100 transitions the reflector device from a transmitting mode of operation to a receiving mode of operation and the initiator device from the receiving mode of operation to the transmitting mode of operation during interval T13. The initiator transmits a continuous wave tone having frequency $f_i$ and the reflector measures phase based on the received continuous wave tone and determines residual frequency offset estimate $f_{ESTR}$. Wireless communications system 100 repeats the sequences performed in intervals T12-T14 for a next value of I (i.e., performs the sequence for no fewer than two different frequencies). In at least one embodiment, after making i phase measurements, the reflector sends the phase measurements to the initiator for generating distance calculations. Note that the sequences of FIGS. 10 and 11 are exemplary only and techniques described herein can be adapted for use in other communications sequences.

Thus, techniques for measuring distance between a first communications device and a second communications device using phase measurements have been disclosed. The description of the invention set forth herein is illustrative and is not intended to limit the scope of the invention as set forth in the following claims. For example, while the invention has been described in an embodiment of a receiver in which the phase measurement technique illustrated in FIG. 4 is implemented, one of skill in the art will appreciate that teachings herein can be utilized with a receiver implementing phase measurement techniques illustrated in FIG. 5 or FIG. 6. In addition, while the invention has been described in embodiments where wireless communications devices coupled to antennas are used, one of skill in the art will appreciate that teachings herein can be utilized with communications devices coupled to other radio frequency sources (e.g., coaxial cable). The terms "first," "second,"

"third," and so forth, as used in the claims, unless otherwise clear by context, is to distinguish between different items in the claims and does not otherwise indicate or imply any order in time, location or quality. For example, "a first received network signal," "a second received network signal," does not indicate or imply that the first received network signal occurs in time before the second received network signal. Variations and modifications of the embodiments disclosed herein may be made based on the description set forth herein, without departing from the scope of the invention as set forth in the following claims.

What is claimed is:

1. A method for communicating between a first radio frequency communications device including a first local oscillator and a second radio frequency communications device including a second local oscillator, the method comprising:
receiving a packet using a receiver of the first radio frequency communications device;
detecting an average frequency offset based on sequential samples of the packet;
applying a first adjustment to the first local oscillator to reduce a frequency offset between the first local oscillator and the second local oscillator, the first adjustment being based on the average frequency offset; and after adjusting the first local oscillator, transmitting a second packet to the second radio frequency communications device by the first radio frequency communications device using the first adjustment and the first local oscillator, wherein the receiver has a low-intermediate frequency (LIF) mode of operation and a zero-intermediate frequency (ZIF) mode of operation, the packet is received in the LIF mode of operation or the ZIF mode of operation, and each sample of the sequential samples is based on a preamble of the packet or a sync word of the packet.

2. The method as recited in claim 1 further comprising:
after transmission of the second packet, transmitting a continuous wave tone by the first radio frequency communications device using the first adjustment and the first local oscillator; and
applying a second adjustment to the second local oscillator at the second radio frequency communications device to reduce the frequency offset between the first local oscillator and the second local oscillator, the second adjustment being based on the continuous wave tone received by the second radio frequency communications device.

3. The method as recited in claim 1 wherein the detecting comprises:
generating a plurality of phase values based on the sequential samples;
computing phase difference estimates based on adjacent phase values of the plurality of phase values;
computing error estimates between the phase difference estimates and corresponding expected phase difference values; and
generating the average frequency offset based on the error estimates.

4. The method as recited in claim 1 further comprising:
after applying the first adjustment to the first local oscillator:
generating a first phase measurement of the first local oscillator by the second radio frequency communications device using samples of a first continuous wave tone received by the second radio frequency communications device in the ZIF mode of operation;
generating a second phase measurement of the second local oscillator by the first radio frequency communications device using second samples of a second continuous wave tone received by the first radio frequency communications device in the ZIF mode of operation; and
estimating a distance between the first radio frequency communications device and the second radio frequency communications device based on the first phase measurement and the second phase measurement.

5. The method as recited in claim 1 further comprising:
sending a request to the first radio frequency communications device by the second radio frequency communications device to initiate communication between the first radio frequency communications device and the second radio frequency communications device;
responding to the request by the first radio frequency communications device; and
transmitting the packet by the second radio frequency communications device after receiving from the first radio frequency communications device a response to the request.

6. The method as recited in claim 1 wherein the first radio frequency communications device is a reflector communications device compliant with a Bluetooth Low Energy standard communications protocol, the second radio frequency communications device is an initiator communications device compliant with the Bluetooth Low Energy standardized communications protocol, the packet has a payload with a length of zero, and the reflector communications device applies the first adjustment during a frequency compensation interval prior to exchanging continuous wave tones for distance measurements.

7. The method as recited in claim 1 wherein applying the first adjustment comprises:
adding the first adjustment to a control value provided to the first local oscillator.

8. The method as recited in claim 1 wherein applying the first adjustment comprises:
writing the first adjustment to a storage element; and
executing instructions that combine contents of the storage element with a control value provided to the first local oscillator.

9. The method as recited in claim 1 wherein the first adjustment is applied after application of an initial frequency offset adjustment to the first local oscillator.

10. A method for communicating between a first radio frequency communications device including a first local oscillator and a second radio frequency communications device including a second local oscillator, the method comprising: receiving a packet using a receiver of the first radio frequency communications device; detecting an average frequency offset based on sequential samples of the packet; and applying a first adjustment to the first local oscillator to reduce a frequency offset between the first local oscillator and the second local oscillator, the first adjustment being based on the average frequency offset; after adjusting the first local oscillator, transmitting a second packet to the second radio frequency communications device by the first radio frequency communications device using the first adjustment and the first local oscillator;
transmitting a first continuous wave tone by the first radio frequency communications device using the first local oscillator and the first adjustment; and receiving a second continuous wave tone by the first radio frequency communications device in a zero-intermediate frequency (ZIF) mode of operation using the first local oscillator and the first adjustment.

11. The method as recited in claim 10 wherein the receiver has a low-intermediate frequency (LIF) mode of operation and the ZIF mode of operation, the packet is received in the LIF mode of operation or the ZIF mode of operation, and each sample of the sequential samples is based on a preamble of the packet or a sync word of the packet.

12. The method as recited in claim 10 wherein the first radio frequency communications device is a reflector communications device compliant with a Bluetooth Low Energy standard communications protocol, the second radio frequency communications device is an initiator communications device compliant with the Bluetooth Low Energy standardized communications protocol, the packet has a payload with a length of zero, and the reflector communications device applies the first adjustment during a frequency compensation interval prior to exchanging continuous wave tones for distance measurements.

13. A radio frequency communications system comprising: a first radio frequency communications device comprising: a receiver comprising: a first local oscillator;
a detector configured to generate an average frequency offset based on sequential samples of a packet; and a digital circuit configured to apply a first adjustment to the first local oscillator to reduce a frequency offset between the first local oscillator and a second local oscillator of a second radio frequency communications device, the first adjustment being based on the average frequency offset, wherein the receiver has a low-intermediate frequency (LIF) mode of operation and a zero-intermediate frequency (ZIF) mode of operation, the packet is received in the LIF mode of operation or the ZIF mode of operation, and each sample of the sequential samples is based on a preamble of the packet or a sync word of the packet.

14. The radio frequency communications system as recited in claim 13 wherein the detector is configured to generate a plurality of phase values based on corresponding samples of the sequential samples, the detector comprising:
a frequency offset estimator configured to compute phase difference estimates based on adjacent phase values of the plurality of phase values and to compute error estimates between the phase difference estimates and corresponding expected phase difference values, and configured to generate the average frequency offset based on the error estimates.

15. The radio frequency communications system as recited in claim 14 wherein the detector further comprises:
a processor configured to execute instructions to:
compute the error estimates between the phase difference estimates and expected phase difference values; and
compute the average frequency offset based on the error estimates.

16. The radio frequency communications system as recited in claim 13 further comprising:
a controller configured to compute the first adjustment during a first interval and configured to hold the first adjustment of the first local oscillator after the first interval and during a phase measurement interval; and
the second radio frequency communications device configured to apply a second adjustment to the second local oscillator after the first interval.

17. The radio frequency communications system as recited in claim 13 wherein the first radio frequency communications device further comprises:
a transmitter configured to use the first local oscillator to transmit a second packet to the second radio frequency communications device after the first local oscillator is adjusted and configured to transmit a continuous wave tone after transmission of the second packet.

18. The radio frequency communications system as recited in claim 17 further comprising:
the second radio frequency communications device configured to apply a second adjustment to the second local oscillator, the second adjustment being based on the continuous wave tone received by the second radio frequency communications device.

19. The radio frequency communications system as recited in claim 13 wherein the first radio frequency communications device is a reflector communications device compliant with a Bluetooth Low Energy standard communications protocol, the second radio frequency communications device is an initiator communications device compliant with the Bluetooth Low Energy standard communications protocol, and the reflector communications device applies the first adjustment during a frequency compensation interval prior to a secure quick tone exchange.

20. A method for communicating between a first radio frequency communications device including a first local oscillator and a second radio frequency communications device including a second local oscillator, the method comprising:
receiving, by the first radio frequency communications device, a request to initiate communications from the second radio frequency communications device;
receiving a packet by the first radio frequency communications device after the first radio frequency communications device transmits a response to the request;
applying a first adjustment to the first local oscillator to reduce a frequency offset between the first local oscillator and the second local oscillator, the first adjustment being based on the packet;
transmitting a second packet to the second radio frequency communications device by the first radio frequency communications device using the first local oscillator and the first adjustment; and
after transmission of the second packet, transmitting a continuous wave tone by the first radio frequency communications device using the first local oscillator and the first adjustment; and
applying a second adjustment to the second local oscillator at the second radio frequency communications device, the second adjustment being based on the continuous wave tone received by the second radio frequency communications device; and
after applying the second adjustment to the second local oscillator:
generating a first phase measurement of the first local oscillator by the second radio frequency communications device using a second continuous wave tone received by the second radio frequency communications device in a zero-intermediate frequency (ZIF) mode of operation;
generating a second phase measurement of the second local oscillator by the first radio frequency communications device using a third continuous wave tone received by the first radio frequency communications device in the ZIF mode of operation; and estimating a distance between the first radio frequency communications device and the second radio frequency communications device based on the first phase measurement and the second phase measurement.

21. The method as recited in claim 20 further comprising: applying a third adjustment to the first local oscillator, the third adjustment being based on a third packet received by the first radio frequency communications device.

\* \* \* \* \*